(12) United States Patent
Bavois

(10) Patent No.: US 10,775,445 B2
(45) Date of Patent: Sep. 15, 2020

(54) METHOD FOR DETECTING AN OPEN LOAD

(71) Applicants: Continental Automotive France, Toulouse (FR); Continental Automotive GmbH, Hannover (DE)

(72) Inventor: Thierry Bavois, Toulouse (FR)

(73) Assignees: Continental Automotive France (FR); Continental Automotive GmbH (DE)

( * ) Notice: Subject to any disclaimer, the term of this patent is extended or adjusted under 35 U.S.C. 154(b) by 324 days.

(21) Appl. No.: 15/780,486

(22) PCT Filed: Nov. 18, 2016

(86) PCT No.: PCT/EP2016/001929
§ 371 (c)(1),
(2) Date: May 31, 2018

(87) PCT Pub. No.: WO2017/092846
PCT Pub. Date: Jun. 8, 2017

(65) Prior Publication Data
US 2018/0372786 A1    Dec. 27, 2018

(30) Foreign Application Priority Data

Dec. 3, 2015 (FR) .................................... 15 61810

(51) Int. Cl.
| | |
|---|---|
| *G01R 31/02* | (2006.01) |
| *G01R 31/34* | (2020.01) |
| *G01R 31/40* | (2020.01) |
| *G01R 31/28* | (2006.01) |
| *G01R 31/50* | (2020.01) |

(Continued)

(52) U.S. Cl.
CPC ............ *G01R 31/50* (2020.01); *G01R 31/007* (2013.01); *G01R 31/343* (2013.01); *G01R 31/40* (2013.01); *G01R 31/2812* (2013.01); *G01R 31/42* (2013.01)

(58) Field of Classification Search
CPC .... G01R 31/50; G01R 31/007; G01R 31/343; G01R 31/40; G01R 31/2812; G01R 31/42
See application file for complete search history.

(56) References Cited

FOREIGN PATENT DOCUMENTS

| | | |
|---|---|---|
| EP | 0848492 A1 | 6/1998 |
| EP | 2139105 A2 | 12/2009 |
| WO | 2014074290 A1 | 5/2014 |

OTHER PUBLICATIONS

Infineon, Application Note, "Profet™ + Current Sense: What the Designer Should Know", Smart High Side Switches, Rev. 1.1, Mar. 3, 2014—pp. 1-34.

(Continued)

*Primary Examiner* — Manuel L Barbee
(74) *Attorney, Agent, or Firm* — RatnerPrestia

(57) ABSTRACT

A method making it possible to diagnose whether an open load or a load is indeed present in a system including a resistive or inductive load controlled by a control transistor. The method envisages measuring the intensity of the current in the branch formed by the closed control transistor and the load, then, successively, comparing it with a positive threshold, comparing it with a negative threshold and lastly comparing its positive or negative variation over a timeframe $\Delta t$ with respect to a reference slope to determine whether a load is indeed present or else an open-load situation is present. The present invention is in particular intended for use in the automotive field, to allow the reliable diagnosis of the presence or absence of an open-load situation.

11 Claims, 2 Drawing Sheets

(51) Int. Cl.
*G01R 31/00* (2006.01)
*G01R 31/42* (2006.01)

(56) References Cited

OTHER PUBLICATIONS

International Search Report and Written Opinion for International Application No. PCT/EP2016/001929, Dec. 22, 2016, 11 pages.

METHOD FOR DETECTING AN OPEN
LOAD

CROSS REFERENCE TO RELATED
APPLICATIONS

This application is the U.S. National Phase Application of PCT International Application No. PCT/EP2016/001929, filed Nov. 18, 2016, which claims priority to French Patent Application No. 1561810, filed Dec. 3, 2015, the contents of such applications being incorporated by reference herein.

FIELD OF THE INVENTION

The invention relates to a method for detecting the occurrence of an "open-load" situation, corresponding to a situation in which a resistive or inductive load, supplied with power by a power electronic circuit, is disconnected or, more broadly, to a situation in which there is an open circuit between the output of the transistor transmitting the signal controlling the load in question and said load.

The present invention also relates to a method making it possible to improve the capacity to establish diagnoses aiming to determine the presence or absence of an open-load situation in the case in which the control transistor is closed—in the prior art the expression "ON load" is then used, while the expression "OFF load" is used when the control transistor is open, preventing any control signal from being transmitted to said load.

BACKGROUND OF THE INVENTION

In the context of motor control applications, or applications relating to the control of any electric machine or generally to the control of a load, regardless of whether it is inductive or resistive, it is of course essential to be able to determine whether the load is present or not.

Specifically, in particular in the automotive field but also in other technical fields in which a resistive or inductive load is driven using an electronic circuit in which, ultimately, a control transistor transmits a control signal to said load, the ability to detect any occurrence of an open-load situation is essential. The ability to make this diagnosis quickly and reliably is also required.

Thus, to detect faults in a circuit, such as the breakage of a wire or the disconnection of the load, open-load (according to the term often used by those skilled in the art) detection functions have been developed.

In practice, according to the prior art, there are two circumstances under which an open load is sought:
the most common, an open load is sought "ON load". In this case, the load is being controlled, and it is sought to start up the load, i.e. to pass a current through the branch formed by the control transistor and the load;
it is also possible to search for an open load "OFF load":
in this case, it is also sought to pass a current through the load, but it must be a very "small" current that will not trigger the operation of the load (which may be complicated: in particular, the current to be circulated must preferably be at least higher than contact deoxidation current) and this also requires the presence of an additional circuit, comprising an external current source for managing said small current.

In both cases, if a sufficient current effectively flows through the load, and hence through the branch formed by the control transistor and the load, a diagnosis of a load being present may be established. In the opposite case, it is possible that there is an open-load situation.

In the context of the present invention, the proposed method is implemented "ON load".

In this case, according to the prior art, several methods for detecting a potential open load are known, the method used depending on the type of load: resistive or inductive.

In the case of a resistive load, since the control transistor is closed, it is sought to pass a current through the load. If a current is measured between the output of the control transistor and the load, and if the intensity of this current is higher than a predetermined positive threshold, then a diagnosis that there is no open load may be established. If no current having an intensity higher than the predetermined positive threshold is detected, then a diagnosis that there is an open-load, situation may potentially be established.

In the case of an inductive load, a potential control current takes time to be established on the branch formed by the control transistor and the load. Because of this, it is necessary to wait a certain amount of time before being able to establish a diagnosis relating to a potential open-load situation. In practice, when the control transistor is closed in the presence of the load, the load is discharged into the electronic circuit. If the control transistor is opened, the load is discharged into a parasitic or flyback diode. Consequently, if a reversal of the direction of the current between the control transistor and the load is detected when said control transistor is closed, then a diagnosis that the load is present may be established. Conversely, if the load is not present (open load), then the load is not discharged into a diode when the control transistor is opened and no current reversal can be detected, allowing a diagnosis of an open load to be established.

The first method, consisting in seeking to measure a current having an intensity higher than a predetermined positive threshold, is quite effective in the case of a resistive load. However, in the case of an inductive load, the time required to establish a confident diagnosis is detrimental, since it is generally necessary to know immediately, or as quickly as possible, whether the load is open or not when load control is implemented.

In the prior art, this paradox results in numerous false detections: an open load may thus be diagnosed when in fact the load is present, the time needed to establish a current having an intensity higher than the predetermined positive threshold proving to be too long for load control.

Additionally, in the time taken for the current to be established in the branch formed by the control transistor and an inductive load, it is possible that load control will have reversed the direction of the control current, such that the time needed before a current having an intensity higher than the predetermined positive threshold is detected may be even longer.

To overcome this drawback, methods have been developed and belong to the recent prior art. To limit the time needed to establish a diagnosis of an open load, these techniques make provision for influencing load control to force it to control the load so that a faster diagnosis may be established. Otherwise, it is often necessary to wait, potentially for a long time from the point of view of the application, for load control to generate commands allowing conditions making it possible to establish the diagnosis of an open load to be present.

The major drawbacks of this known principle, consisting in seeking to measure a current having an intensity higher than a predetermined positive threshold so as to establish a diagnosis of an open load, therefore reside in the substantial amount of time needed to obtain a reliable diagnosis and/or in the need to influence the commands that are normally generated by load control to more rapidly obtain the conditions allowing such a diagnosis to be established.

The second family of known techniques consisting, in the case of an inductive load, in detecting a reversal of the current on the branch formed by the control transistor and the load when closing/opening said control transistor is more complex to implement and furthermore still involves a potentially long time before it is capable of establishing a reliable diagnosis. Specifically, it is necessary for the load to be properly charged for it to be possible to detect a discharge thereof, and hence the reversal of the current, when the control transistor is closed after it having been open.

Otherwise, it is not possible to detect the load. In this case too, it is therefore necessary, before establishing a reliable diagnosis, for the control transistor to have been closed long enough to allow the load to charge.

The known solutions, as in the preceding case, consist in waiting for the required time or in influencing load control.

SUMMARY OF THE INVENTION

There is therefore a need for a method, implemented by suitable means, for detecting an open-load situation quickly and without influencing load control. More specifically, the method according to an aspect of the invention aims to make it possible to establish a reliable diagnosis relating to the presence or absence of an open-load situation quickly and without influencing load control.

To this end, an aspect of the present invention is an open-load detection method for delivering a diagnosis as to whether an open-load situation is present or not at a given time in a system comprising a power electronic circuit comprising at least one control transistor for transmitting a control current to a load, said transistor, in a closed position, forming, with said load, a branch, said method aiming to detect, for the purpose of establishing the diagnosis, the potential presence of an open circuit between the transistor and the load on said branch, or the disconnection of the load, said method comprising the following steps, the control transistor being closed:

i. measuring, at a time T, the intensity of a current on the branch formed by the control transistor and the load;
ii. comparing the measured intensity of the current with a predetermined first, positive threshold and, if the measured intensity of the current is higher than the first, positive threshold, delivering a diagnosis that an open-load situation is not present at time T; otherwise, the method moves on to step iii.;
iii. comparing the measured intensity of the current with a predetermined second, negative threshold and, if the measured intensity of the current is lower than the second, negative threshold, delivering a diagnosis that an open-load situation is not present at time T; otherwise, the method moves on to step iv.;
iv. if the measured intensity of the current is, at time T, comprised between the second, negative threshold and the first, positive threshold, measuring the intensity of the current on the branch formed by the control transistor and the load at a later time T+ΔT;
v. calculating the positive or negative variation ΔI in the measured intensity of the current between time T and time T+ΔT;

vi. comparing the absolute value of the ratio $$\frac{\Delta I}{\Delta T}$$

with a reference slope; and
vii. if the absolute value of the ratio $$\frac{\Delta I}{\Delta T}$$

is higher than the reference slope, delivering a diagnosis that an open-load situation is not present at time T; otherwise, delivering a diagnosis that an open-load situation is present at time T.

Thus, the method according to an aspect of the invention makes it possible to establish a diagnosis relating to the presence or absence of an open-load situation quickly and reliably, and without requiring load control to be influenced.

According to one embodiment, step iv. includes an initial sub-step consisting in comparing the time elapsed since a last command to close the control transistor was issued and the time needed to close said control transistor and, if the elapsed time is shorter than the time needed to close the control transistor, information is delivered stating that no diagnosis could be made and, otherwise, the method continues with step iv.

According to one embodiment, at the end of step i., if the measured intensity of the current is higher than a current limit of the power electronic circuit, a diagnosis that an open-load situation is not present at time T is delivered.

According to one embodiment, at the end of step i., if the measured intensity of the current is higher than a maximum current intensity withstood by the load or by the power electronic circuit, such that said measured current corresponds to an overcurrent, a diagnosis that an open-load situation is not present at time T is delivered.

According to one embodiment, the method according to an aspect of the invention includes a step viii. consisting in delivering information stating that no diagnosis could be made if no diagnosis has been delivered in any of the preceding steps.

According to one embodiment, the load is a resistive load.
According to one embodiment, the load is an inductive load.

Another aim of an aspect of the invention is a system for controlling a DC motor, comprising a power electronic circuit including a control transistor capable of transmitting a control signal to said DC motor, said system further comprising means for measuring the intensity of the current on the branch formed by the control transistor and the motor, and comparing means, which means are suitable for implementing the method such as briefly described above.

Another aim of an aspect of the invention is an automotive vehicle comprising at least one DC motor, comprising a system for controlling the DC motor such as briefly described above.

According to one embodiment, the DC motor is an injector, consisting of an inductive load formed of a solenoid.

BRIEF DESCRIPTION OF THE DRAWINGS

The invention will be better understood upon reading the following description, given solely by way of example, and with reference to the appended drawings, in which.

DETAILED DESCRIPTION OF THE PREFERRED EMBODIMENTS

It should be noted that the figures disclose an aspect of the invention in a detailed manner so as to enable the implementation thereof, said figures also being able to serve to better define an aspect of the invention, of course.

An aspect of the invention is presented mainly with a view to being applied to the detection of an open load in a system embedded in an automotive vehicle. However, other applications are also within the scope of the present invention, in particular with a view to detecting an open load in any type of application, to make it possible to establish a diagnosis of the presence of an open load or a load in a system comprising an electronic circuit controlling a resistive or inductive load, in particular small DC motors.

Figure 1:
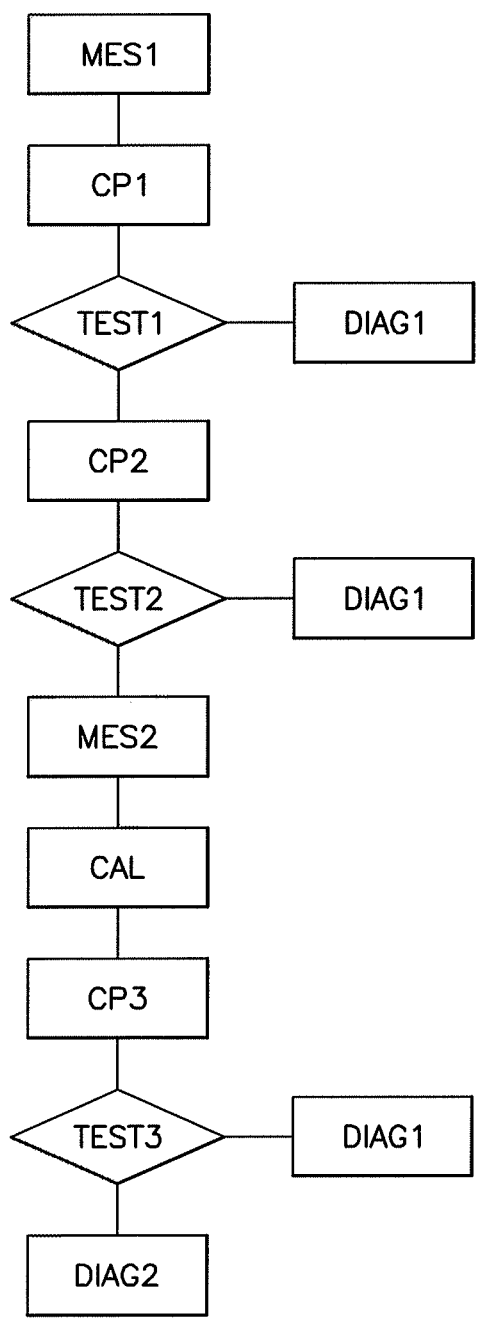
FIG. 1 is a diagram showing the steps of the method for detecting an open load, according to an aspect of the invention.

With reference to FIG. 1, an aspect of the present invention aims to improve the capacity to establish a diagnosis relating to the presence or absence of an open-load situation in a system in which a power electronic circuit generates control signals that are transmitted to a resistive or inductive load, ultimately via a control transistor linked to said load by a wire.

In practice, said control transistor may be alone in the circuit under consideration, or be one control transistor among others that are capable of transmitting control signals to said load, for example within an H-bridge.

The control transistor, intended to transmit a current corresponding to a control signal to the load, forms a branch with said load.

In the context of an aspect of the present invention, it is desired to establish a diagnosis of an open load in an "ON load" situation, i.e. in a situation in which a command to close the control transistor is issued, to allow the intensity of a current flowing through said branch, and hence through the load, if said load is indeed present, to be measured.

As shown in the diagram in FIG. 1, a plurality of tests are successively carried out on the basis of one or more measurements of the intensity of the current flowing through the branch formed by the control transistor and the load.

At a time t at which the establishment of a diagnosis on a potential open-load situation is required, the intensity of the current in the branch formed by the control transistor and the load is measured MES1.

This current is compared CP1 with a predetermined first, positive threshold.

A first test TEST1 is then implemented: if the intensity of the current measured at time t is higher than the predetermined positive threshold, a diagnosis DIAG1 that the load is indeed present is established. These steps of measuring the current MES1, of comparing CP1 with a first, positive threshold and of establishing a diagnosis DIAG1 that a load is present in the case of the intensity of the current being higher than the positive threshold are in accordance with the prior art.

According to an aspect of the invention, in the case in which the measured intensity of the current in the branch formed by the control transistor and the load is not higher than the positive threshold, provision is made for a new comparison CP2 with a second predetermined threshold, this time a negative threshold, to account for the possibility that the load is in operation, for example, for a motor, rotating in a negative direction.

A second test TEST2 is then implemented: if the intensity of the current measured at time t is lower than the predetermined negative threshold, i.e. also negative and higher, in terms of absolute value, than the predetermined negative threshold, a diagnosis DIAG1 that the load is indeed present is established.

In the opposite case, if the intensity of the current measured at time t in the branch formed by the control transistor and the load is in fact comprised between the second, negative threshold and the first, positive threshold, the present invention makes provision for taking a second measurement MES2 of the intensity of the current in the same branch, at a time t+Δt shortly after time t, so as to measure the variation in the intensity of the current in the branch with time.

The ratio between the variation Δi in the measured intensity between time t and time t+Δt is then calculated CAL, then a comparison CP3 between this ratio and a reference slope is made.

In this way, the slope representing the variation in the measured intensity of the current in the branch with time, regardless of whether said variation is positive or negative, via the ratio $$\frac{\Delta i}{\Delta t},$$

is compared with a predetermined reference slope. If the ratio $$\frac{\Delta i}{\Delta t}$$

is higher, in terms of absolute value, than the reference slope, then this means that the intensity of the current in the branch is varying in a way that indicates the presence of a load.

Thus, if the comparison TEST3 shows that the ratio $$\frac{\Delta i}{\Delta t}$$

is higher than the reverence slope, a diagnosis DIAG1 that the load is indeed present is established.

In the opposite case, if the comparison TEST3 shows that the ratio $$\frac{\Delta i}{\Delta t}$$

is lower than the reference slope, a diagnosis DIAG2 that an open-load situation is present is established.

It is further specified that after the measurement step MES1, if the measured intensity of the current is higher than a current limit of the electronic circuit or of the load or if the measured intensity of the current is equivalent to an overcurrent in the context of the system under consideration, the method according to an aspect of the invention may then make provision for the diagnosis DIAG1 that the load is indeed present to be established directly.

Furthermore, in the case in which no diagnosis could be made, the method makes provision for information stating that no diagnosis could be made to be delivered.

In particular, provision may be made, according to one mode of implementation of the method according to an aspect of the invention, for the time elapsed since the last command to close the control transistor was issued to be measured and, if this time is shorter than the time needed for said transistor to close, then the method makes provision for information stating that no diagnosis could be made to be delivered.

Figure 2:
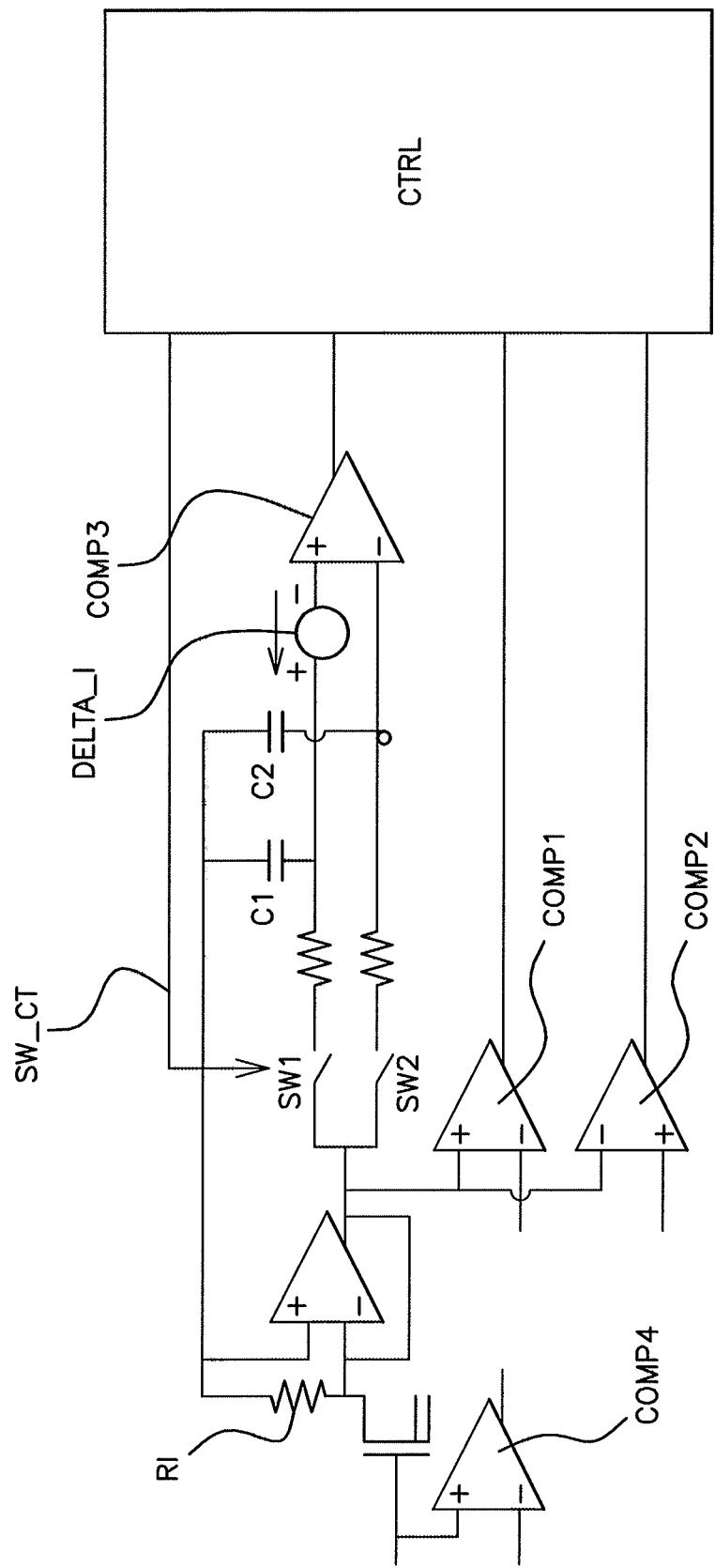
FIG. 2 shows a simplified diagram of one example of an electronic circuit allowing the implementation of the method for detecting an open load, according to an aspect of the invention.

FIG. 2 shows one exemplary embodiment of an electronic circuit allowing the implementation of the method according to an aspect of the invention.

Thus, a component CTRL is responsible for establishing and delivering the diagnosis that an open load or a load is indeed present in the system, or for delivering the information stating that no diagnosis could be made.

According to the embodiment shown, the comparator COMP4 is first of all responsible for checking that the time elapsed since the last command to close the control transistor is indeed longer than the time needed for said transistor to close.

Next, via the monitoring resistor RI, the intensity of the current in the branch formed by the control transistor and the load (neither is shown) is measured and this information is "stored" via the capacitor C1.

The comparators COMP1 and COMP2 successively make the comparisons with the first, positive threshold and with the second, negative threshold, as described above. If the measured intensity of the current is comprised between the second, negative threshold and the first, positive threshold, the intensity of the current in the branch formed by the control transistor and the load is again measured at a time t+Δt slightly after time t, and this information is "stored" via the capacitor C2.

After calculating the variation in the current Δi over the timeframe Δt using the suitable component DELTA_I, this variation Δi is compared, via the comparator COMP3, with a reference slope. If the ratio $$\frac{\Delta i}{\Delta t}$$

is higher than the predetermined reference slope, then the variation in the current in the branch is considered to be sufficient to allow the diagnosis DIAG1 that the load is indeed present to be established.

In the opposite case, if the ratio $$\frac{\Delta i}{\Delta t}$$

is lower than the reverence slope, a diagnosis DIAG2 that an open-load situation is present is established.

Furthermore, according to the embodiment shown by way of illustration in FIG. 2, the switches SW1 and SW2, controlled by means of a suitable component represented in the figure by the arrow SW_CT, allow, at appropriate times, the capacitor C1 to be charged with the voltage that is proportional to the intensity of the current measured at time t, then the capacitor C2 to be charged with the voltage that is proportional to the intensity of the current measured at time t+Δt, and lastly, if needed, the variation in the current Δi to be calculated and to be compared with the reference slope.

It is specified that the circuit shown in FIG. 2 allows, in its current form, a positive variation in the intensity of the current in the branch to be measured. However, the addition of an additional comparator, such an addition being within the scope of a person skilled in the art, would allow a negative variation in the intensity of the current in the branch to be measured, allowing the method according to an aspect of the invention to be implemented optimally.

Consequently, a further aim of an aspect of the present invention is a system for controlling a DC motor, incorporating this type of electronic circuit, capable of implementing the method described above.

In summary, an aspect of the present invention relates to a method making it possible to diagnose whether an open load or a load is indeed present in a system comprising a resistive or inductive load controlled by a control transistor.

The method according to an aspect of the invention envisages measuring the intensity of the current in the branch formed by the closed control transistor and the load, then, successively, comparing it with a positive threshold, comparing it with a negative threshold and lastly comparing its positive or negative variation over a timeframe Δt with respect to a reference slope to determine whether a load is indeed present or else an open-load situation is present.

An aspect of the present invention is in particular intended for use in the automotive field, to allow the reliable diagnosis of the presence or absence of an open-load situation, typically in the context of controlling inductive loads, such as the injectors of an automotive vehicle engine (which typically consist of solenoids), or else of controlling DC motors controlling, for example, air inlet flaps.

It is clarified furthermore that aspects of the present invention are not limited to the examples described above, and is open to many variants that are accessible to those skilled in the art.

The invention claimed is:

1. An open-load detection method for delivering a diagnosis as to whether an open-load situation is present or not at a given time in a system comprising a power electronic circuit comprising at least one control transistor for transmitting a control current to a load, said transistor, in a closed position, forming, with said load, a branch, said method aiming to detect, for the purpose of establishing the diagnosis, the potential presence of an open circuit between the transistor and the load on said branch, or the disconnection of the load, said method comprising the following steps, the control transistor being closed:

i measuring, at a time T, the intensity of a current on the branch formed by the control transistor and the load;

ii comparing the measured intensity of the current with a predetermined first, positive threshold and, if the measured intensity of the current is higher than the first, positive threshold, delivering a diagnosis that an open-load situation is not present at time T; otherwise, the method moves on to step iii;

iii comparing the measured intensity of the current with a predetermined second, negative threshold and, if the measured intensity of the current is lower than the second, negative threshold, delivering a diagnosis that an open-load situation is not present at time T; otherwise, the method moves on to step iv;

iv if the measured intensity of the current is, at time T, comprised between the second, negative threshold and the first, positive threshold, measuring the intensity of the current on the branch formed by the control transistor and the load at a later time T+ΔT;

v calculating the positive or negative variation ΔI in the measured intensity of the current between time T and time T+ΔT;

vi. comparing the absolute value of the ratio $$\frac{\Delta I}{\Delta T}$$

with a reference slope; and vii if the absolute value of the ratio $$\frac{\Delta I}{\Delta T}$$

is higher than the reference slope, delivering a diagnosis that an open-load situation is not present at time T; otherwise, delivering a diagnosis that an open-load situation is present at time T.

2. The open-load detection method as claimed in claim 1, wherein step iv includes an initial sub-step comprising comparing the time elapsed since a last command to close the control transistor was issued and the time needed to close said control transistor and, if the elapsed time is shorter than the time needed to close the control transistor, information is delivered stating that no diagnosis could be made and, otherwise, the method continues with step iv.

3. The open-load methods as claimed in claim 2, wherein at the end of step i, if the measured intensity of the current is higher than a current limit of the power electronic circuit, a diagnosis that an open-load situation is not present at time T is delivered.

4. The open-load detection method as claimed in claim 1, wherein, at the end of step i, if the measured intensity of the current is higher than a current limit of the power electronic circuit, a diagnosis that an open-load situation is not present at time T is delivered.

5. The open-load detection method as claimed in claim 1, wherein at the end of step i, if the measured intensity of the current is higher than a maximum current intensity withstood by the load or by the power electronic circuit, such that said measured current corresponds to an overcurrent, a diagnosis that an open-load situation is not present at time T is delivered.

6. The open-load detection method as claimed in claim 1, further comprising a step viii of delivering information stating that no diagnosis could be made if no diagnosis has been delivered in any of the preceding steps.

7. The open-load detection method as claimed in claim 1, wherein said load is a resistive load.

8. The open-load detection method as claimed in claim 1, wherein said load is an inductive load.

9. A system for controlling a DC motor, comprising:
 a power electronic circuit including a control transistor capable of transmitting a control signal to said DC motor,
 means for measuring an intensity of the current on a branch formed by the control transistor and the motor, and
 comparing means, which means are suitable for implementing the method as claimed in claim 1.

10. An automotive vehicle comprising at least one DC motor, further comprising system for controlling the DC motor as claimed in claim 9.

11. The automotive vehicle as claimed in claim 10, wherein the DC motor is an injector, having an inductive load formed from a solenoid.

\* \* \* \* \*